United States Patent [19]
Shen

[11] Patent Number: 6,031,429
[45] Date of Patent: Feb. 29, 2000

[54] CIRCUIT AND METHOD FOR REDUCING LOCK-IN TIME IN PHASE-LOCKED AND DELAY-LOCKED LOOPS

[75] Inventor: Fang Shen, San Jose, Calif.

[73] Assignee: Silicon Magic Corporation, Santa Clara, Calif.

[21] Appl. No.: 08/834,550

[22] Filed: Mar. 19, 1997

[51] Int. Cl.[7] ........................................... H03L 7/00
[52] U.S. Cl. .................... 331/17; 331/1 A; 327/156; 327/159
[58] Field of Search ................ 331/17, 1 A; 327/148, 327/142, 156, 159; 375/376

[56] References Cited

U.S. PATENT DOCUMENTS 5,223,755  6/1993  Richley ................................ 331/1 A
5,523,726  6/1996  Assar et al. ......................... 331/1 A

*Primary Examiner*—Arnold Kinkead
*Attorney, Agent, or Firm*—Sawyer Law Group

[57] ABSTRACT

Method and circuit aspects for improving lock-in time following power-up in a phase-locked loop are provided. The circuit and method for providing same includes a phase-locked loop, the phase-locked loop comprising a low pass filter, and a pulse generation circuit coupled to the low pass filter. The pulse generation circuit provides a control pulse of predetermined duration to increase a voltage across the low pass filter and reduce lock-in time in the phase-locked loop following power-up. The pulse generation circuit further includes a plurality of logic gates, the plurality of logic gates including a plurality of inverters coupled to a NAND gate.

6 Claims, 3 Drawing Sheets

6,031,429

CIRCUIT AND METHOD FOR REDUCING LOCK-IN TIME IN PHASE-LOCKED AND DELAY-LOCKED LOOPS

FIELD OF THE INVENTION

The present invention relates to phase-locked loops (PLLs) and more particularly to reducing lock-in time following power-up in PLLs.

BACKGROUND OF THE INVENTION

Generally, phase-locked loops are circuits that essentially consist of a phase detector which compares the frequency of a voltage-controlled oscillator with that of an incoming carrier signal or reference frequency generator. The output of the phase detector is fed back to the voltage-controlled oscillator after passing through a loop filter in order to maintain the output in phase exactly with the incoming or reference frequency.

A block diagram of a typical PLL is illustrated by FIG. 1a. A divider circuit 10 receives a signal with a reference frequency, $F_{ref}$, and divides the signal by reference delay value, $D_{ref}$, before passing the signal to a phase frequency detector (PFD) 12. The PFD 12 compares the frequency of the reference signal to that of the signal generated by a voltage controlled oscillator (VCO) 14, a typical example of which is illustrated in FIG. 1b. Further included are charge pump 16 which together with low pass filter (LPF) 18, usually a large capacitor, charges up the generated signal to make the phases of the reference signal and generated signal line together. Divider circuits 20 and 22 divide the generated signal by chosen delay values, $D_{fb}$ or $D_{out}$, as the generated signal is fed back to the PFD 12 or out of the PLL.

As described, the LPF 18 is usually a large capacitor, in the range of 100–500 pF (picoFarads), which aids in reducing jittering, especially in faster signals with higher frequencies. Further aiding in the reduction of jittering is a lower charge current value. Generally, during power down mode, the large capacitor in the LPF 18 is shunt to ground. When power-up occurs, the voltage across the large capacitor needs to be charged-up above the threshold value of a MOSFET 23, FIG. 1b, typically used in the VCO 14 before the PLL can begin normal lock-in procedure. Typically, the lock-in time is very long due to the large capacitor and lower charge current value.

Accordingly, a need exists for a simple charge control scheme to reduce the lock-in time upon power-up in a PLL.

SUMMARY OF THE INVENTION

The present invention addresses this need through method and circuit aspects for improving lock-in time following power-up in a phase-locked loop. The circuit and method for providing same includes a phase-locked loop, the phase-locked loop comprising a low pass filter, and a pulse generation circuit coupled to the low pass filter. The pulse generation circuit provides a control pulse of predetermined duration to increase a voltage across the low pass filter and reduce lock-in time in the phase-locked loop following power-up. The pulse generation circuit further includes a plurality of logic gates, the plurality of logic gates including a plurality of inverters coupled to a NAND gate.

With the present invention, a straightforward and efficient system is achieved for reducing the lock-in time following power-up in phase-locked loops. The provision of the pulse generation circuitry in the present invention effectively supports the reduction in lock-in time by assisting in the reaching of a threshold voltage within phase-locked loops. These and other advantages of the aspects of the present invention will be more fully understood in conjunction with the following detailed description and accompanying drawings.

BRIEF DESCRIPTION OF THE DRAWINGS

FIG. 1b illustrates a prior art circuit diagram for VCO 14 of FIG. 1a.

DETAILED DESCRIPTION

The present invention relates to reducing the lock-in time after power-up in a PLL. The following description is presented to enable one of ordinary skill in the art to make and use the invention and is provided in the context of a patent application and its requirements. Various modifications to the preferred embodiment and the generic principles and features described herein will be readily apparent to those skilled in the art. Accordingly, it should be appreciated that although the following is described with reference to a PLL, the principles of the technique of the present invention are equally applicable to delay locked-loop (DLL) circuits, as well. Further, preferred embodiments with specific logic components are described. However, other arrangements of components to achieve the benefits of the present invention may be used according to specific design needs without departing from the spirit and scope of the present invention.

Figure 1A:
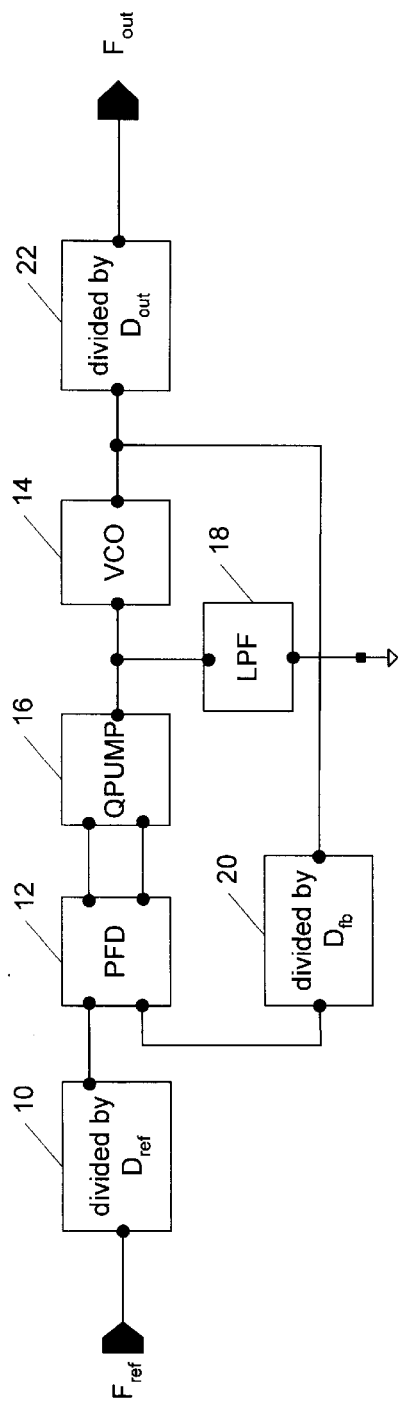
FIG. 1a illustrates a block diagram of a typical PLL.
Figure 1B:
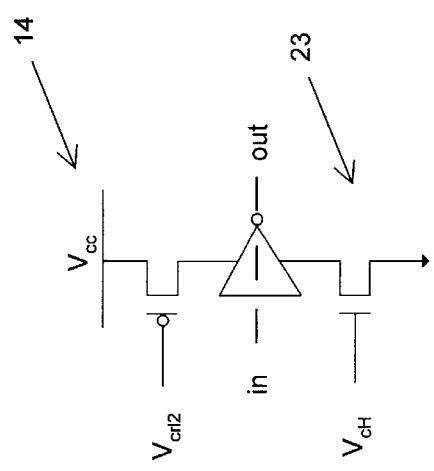
Figure 2:
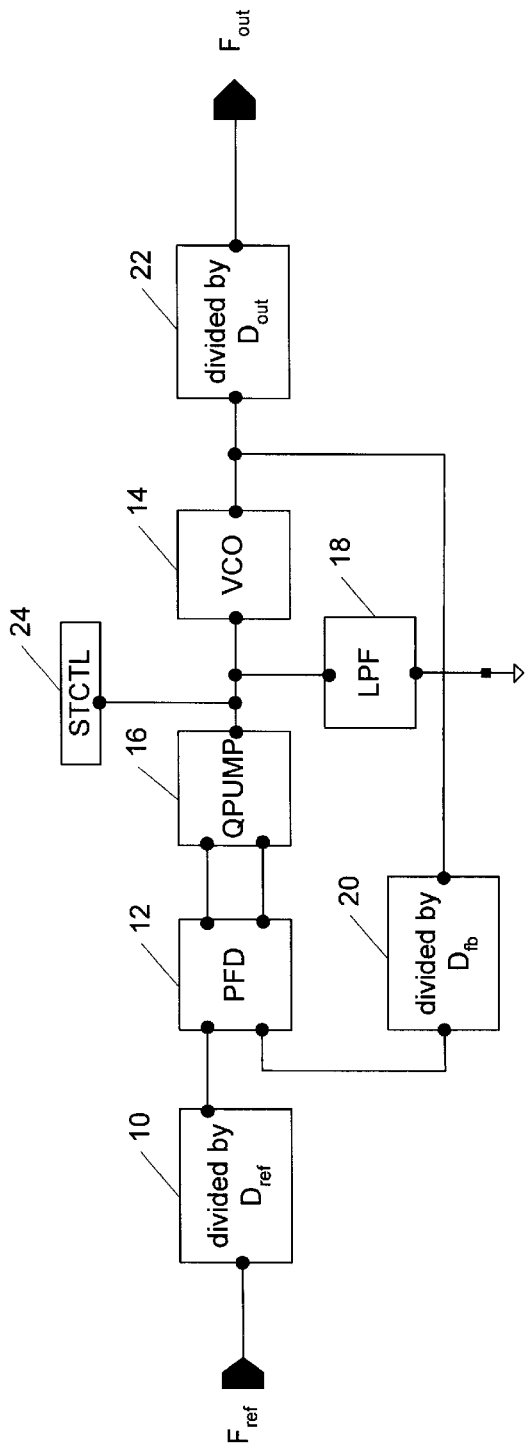
FIG. 2 illustrates an overall block diagram of a PLL with start control pulse circuitry in accordance with the present invention.

As shown in FIG. 2, the typical PLL of FIG. 1a is modified in accordance with the present invention to include a start control pulse (STCTL) circuit 24. In operation, the STCTL circuit 24 suitably receives the power down signal for the PLL and thus senses when power-up occurs. When power-up occurs, a start-control pulse is suitably generated by the STCTL circuit 24 to provide a large current to charge-up the voltage across the LPF 18 more quickly. The width of the start control pulse is alterable and is preferably set to charge the voltage across the LPF 18 close to the threshold voltage of a MOSFET standardly used in the VCO 14. Once the start control pulse has expired, normal charge pump operation suitably occurs.

Figure 3:
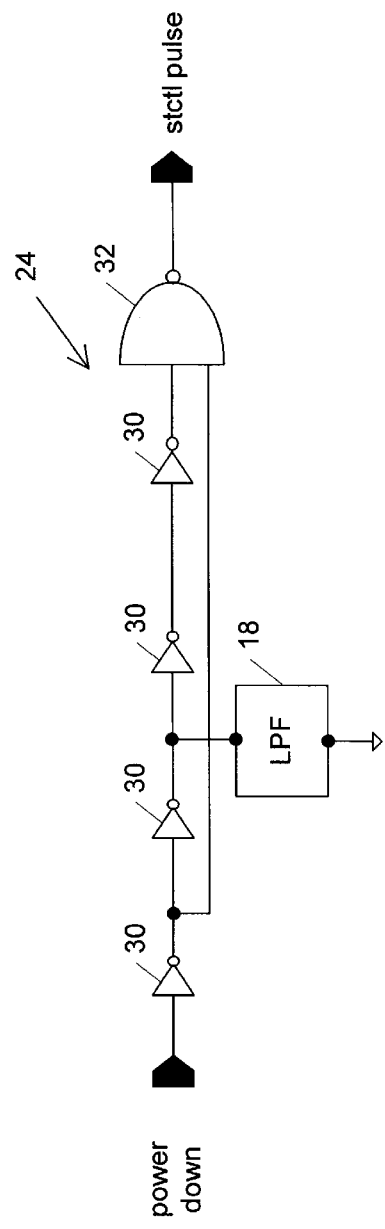
FIG. 3 illustrates the start control pulse circuitry of FIG. 2 in greater detail.

By way of example, FIG. 3 illustrates a preferred embodiment of the STCTL circuit 24. Suitably, the STCTL circuit 24 includes inverters 30 for buffering the power down signal, as is well understood by those skilled in the art. The circuit further suitably includes logic gate 32, e.g., a NAND gate, for receiving the buffered power down signal and the inverse of the power down signal. Thus, when the power down signal transitions upon power-up, the logic of the STCTL circuit 24 appropriately provides start control pulse output signal, stctl pulse, which raises the voltage near the threshold voltage for the VCO 14.

Figure 4:
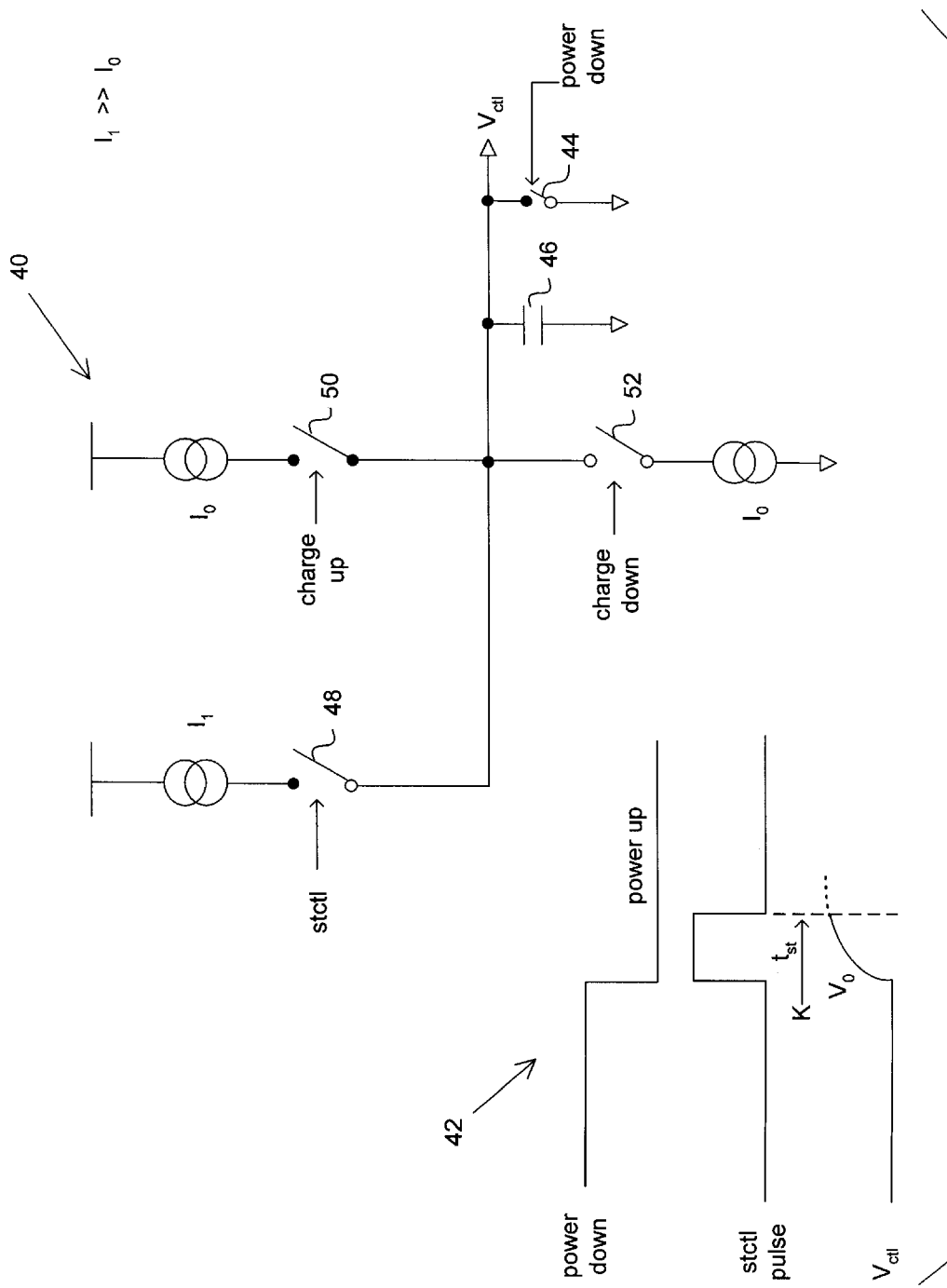
FIG. 4 illustrates a circuit operation schematic and signal diagram in accordance with the use of the start control pulse circuit.

FIG. 4 illustrates a schematic circuit 40 and signal diagram 42 for signal interaction when generating the start control pulse. When the PLL is in power down mode and the power down signal is true, as represented by the closing of the power down switch 44, the LPF capacitor 46 is shunt to ground. When power down is over, power up is begun, as represented by the opening of the power down switch 44. Suitably, this results in the activation of the start control pulse, stctl pulse, with a width of $t_{st}$. The stctl pulse turns on a stctl current switch 48 to speed up the charge up of the voltage across the LPF capacitor 46. The width of the stctl pulse is alterable according to specific design needs and may be changed, for example, by changing the number of inverters used in the STCTl circuit 24 (FIG. 3). Thus, the pulse width of the stctl pulse is controllable and predetermined based on the process and may be programmably provided. A pulse width of 20–30 nanoseconds (ns) has been found to be suitable for some processes. Further, the stctl pulse controls the current $I_1$, which is preferably much larger than $I_0$, where $I_0$ represents the normal operation charge current.

As shown by the vctl signal in the signal diagram 42, the stctl pulse preferably results in an increase in the vctl signal, which suitably represents the voltage of the MOSFET in the VCO 14, to a voltage $V_o$. Preferably, $V_o$ is close to the threshold voltage of the MOSFET in the VCO 14. Once the stctl pulse completes, normal operations in the PLL occurs, represented by the opening of the stctl switch 48 and controlled operation of the charge up and charge down switches, 50 and 52, respectively, as is well understood by those skilled in the art.

By bringing the voltage of the MOSFET close to the threshold voltage with the use of the start control pulse in accordance with the present invention, the lock-in time for a PLL is significantly reduced. By way of example, it has been found by the inventors that a reduction of lock-in time from 120 microseconds to 40 microseconds is readily achieved through the implementation of the present invention. Further, the start control pulse circuitry of the present invention is straightforward and uncomplicated, thus making it easily incorporated into existing PLLs. Additionally, the flexibility to alter the components for the start control pulse circuitry according to specific design needs provides a practical approach for fundamental inclusion into PLLs.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A circuit for improving lock-in time following power-up in a phase-locked loop, the circuit comprising:

a phase-locked loop, the phase-locked loop comprising a low pass filter; and a pulse generation circuit coupled to the low pass filter and comprising a plurality of logic gates, the pulse generation circuit providing a control pulse of predetermined duration to increase a voltage across the low pass filter and reduce lock-in time in the phase-locked loop following power-up, wherein the plurality of logic gates further comprises a plurality of inverters coupled to a NAND gate.

2. The circuit of claim 1 wherein the low pass filter comprises a large capacitor.

3. The circuit of claim 1 wherein the pulse generation circuit provides the control pulse for approximately 20–30 nanoseconds.

4. A method for improving lock-in time following power-up in a phase-locked loop, the method comprising:

forming a phase-locked loop, the phase-locked loop including a low pass filter; and providing pulse generator circuitry comprising a plurality of logic gates in the phase-locked loop coupled to the low pass filter to generate a control pulse for a desired time period to increase voltage across the low pass filter in shorter time following power-up of the phase-locked loop, wherein the plurality of logic gates further comprises a plurality of inverters coupled to a NAND gate.

5. The method of claim 4 wherein generation of the control pulse further comprises generating the control pulse for approximately 20–30 nanoseconds.

6. The method of claim 4 further comprising performing normal charge pump operation in the phase-locked loop when the control pulse is completed.

* * * * *